United States Patent
McKenzie et al.

(10) Patent No.: US 8,309,979 B2
(45) Date of Patent: Nov. 13, 2012

(54) ELECTRICALLY ISOLATED VERTICAL LIGHT EMITTING DIODE STRUCTURE

(75) Inventors: James Stuart McKenzie, Falmouth (GB); Majd Zoorob, Southampton (GB)

(73) Assignee: PhotonStar LED Limited, Hants (GB)

( * ) Notice: Subject to any disclaimer, the term of this patent is extended or adjusted under 35 U.S.C. 154(b) by 189 days.

(21) Appl. No.: 12/677,647

(22) PCT Filed: Sep. 12, 2008

(86) PCT No.: PCT/GB2008/003110
§ 371 (c)(1),
(2), (4) Date: Mar. 11, 2010

(87) PCT Pub. No.: WO2009/034349
PCT Pub. Date: Mar. 19, 2009

(65) Prior Publication Data
US 2010/0201280 A1    Aug. 12, 2010

(30) Foreign Application Priority Data
Sep. 12, 2007 (GB) .................................. 0717802.3

(51) Int. Cl.
*H01L 33/64* (2010.01)

(52) U.S. Cl. ..... 257/93; 257/98; 257/705; 257/E33.075; 438/29

(58) Field of Classification Search ............... 257/93, 257/E33.075
See application file for complete search history.

(56) References Cited

U.S. PATENT DOCUMENTS

| 6,618,409 B1* | 9/2003 | Hu et al. .................... 372/43.01 |
| 2006/0057752 A1* | 3/2006 | Yang ................................ 438/26 |
| 2007/0012937 A1* | 1/2007 | Liu et al. ......................... 257/99 |

FOREIGN PATENT DOCUMENTS

GB    2454060 B    2/2012

OTHER PUBLICATIONS

Response to the International Preliminary Report on Patentability of corresponding European Application No. 08806266.6, dated Jun. 14, 2010.
UK Intellectual Property Office Examination Report of corresponding GB Application No. 0816771.0, dated Apr. 14, 2011.
Response to Examination Report of Apr. 14, 2011, of corresponding GB Application No. 0816771.0 dated Aug. 15, 2011.
UK Intellectual Property Office Examination Report of corresponding GB Application No. 0816771.0, dated Oct. 17, 2011.
Response to Examination Report of Oct. 17, 2011, of corresponding GB Application No. 0816771.0 dated Nov. 14, 2011.

* cited by examiner

*Primary Examiner* — Stephen W Smoot
(74) *Attorney, Agent, or Firm* — Renner, Otto, Boisselle & Sklar, LLP

(57) ABSTRACT

A light emitting device is provided having high luminous output while maintaining high wall plug efficiency, wherein the high thermal and electrical conductivity paths of the device are separated during the semiconductor wafer and die level manufacturing step. The device includes an electrical conducting mirror layer, which reflects at least 60% of generated light incident on it, and an isolation layer having electrical insulating properties and thermal conducting properties. A first electrode, which is not in contact with the main semiconductor layers of the device, is located on the mirror layer. A light emitting module, system and projection system incorporating the light emitting device are also described, as is a method of manufacture of the device.

25 Claims, 14 Drawing Sheets

ELECTRICALLY ISOLATED VERTICAL LIGHT EMITTING DIODE STRUCTURE

This application is a national phase of International Application No. PCT/GB2008/003110 filed Sep. 12, 2008, and published in the English language as WO 2009/034349 on Mar. 19, 2009.

FIELD OF THE INVENTION

The present invention relates to a vertical light emitting diode and module with an improved thermal conductivity path and simplified packaging process.

BACKGROUND TO THE INVENTION

Light emitting diodes are based on a forward biased p-n junction. LEDs have recently reached high brightness levels that have allowed them to be used in new solid-state lighting applications, as well as replacements for high brightness light sources, such as light engines for projectors and automotive car headlights. These markets have also been enabled by the economical gains achieved through the high efficiencies of LEDs, as well as reliability, long lifetime and environmental benefits. These gains have been partly achieved by use of LEDs that are capable of being driven at high currents and hence produce high luminous outputs while still maintaining high wall plug efficiencies.

The efficiency of the LED is critical to ensure that solid state lighting is adopted for general lighting applications and be able to fulfill the environmentally friendly lighting solution for future generations. LED lighting has the potential to be up to 20 times more efficient than the incandescent light bulb and last 50-100 times longer (lasting up to 100,000 hrs), resulting in less physical waste, large energy savings and lower cost of ownership. Solid-state lighting applications require that LEDs exceed efficiencies presently achievable by alternative fluorescent lighting technologies.

Current state-of-the-art LED chip performance is at the level of approximately 150 lumen per Watt (lm/W) of electrical drive for a 0.1 W chip. These lateral type LED devices typically reside on an electrically insulating sapphire substrate. Both n- and p-contacts are accessed from the top surface of the chip. The thermal resistance of Sapphire is high and, as a result, it is not possible to drive this chip harder without significantly degrading the LPW. Presently, state-of-the-art vertical current drive LED chips are approximately around the 115 lm/W for a 1 W chip. The theoretical maximum for a blue LED chip with a yellow Phosphor is approximately between 260 LPW and 330 LPW, depending on the colour temperature of the white light generated. The current LPW efficacy at 1 W drive amounts to a wall plug efficiency of 38%. Thus, more than 60% of the electrical drive current is converted to heat. Typically, so-called power chips are about 1 mm$^2$ and are driven in the range 1.0 to 3.0 W. This amounts to a thermal load density of from 0.6 to higher than 1.8 W/mm$^2$. This is a high figure compared to any other semiconductor device and leads to the need to provide specific high performance packaging solutions. To date most packaging has been adapted from the IC industry, where thermal densities are orders of magnitude lower at 1-3 W/cm$^2$.

It is also of particular interest to maintain the small format light emitting device at a low temperature during operation, as the junction temperate of the LED dramatically affects both its life time and its overall efficiency. As a basic rule, every 10° C. increase (above 25° C.) in junction temperature reduces the life time of the LED by 10 kHrs for a Gallium Nitride LED. It is also a consequence of the increase of the junction temperature that the overall efficiency of a state-of-the-art vertical type LED drops. For example, increasing the junction temperature from 40° C. to a 70° C. will reduce the efficacy of the LEDs by more than 10%. It is noted that this effect increasingly becomes nonlinear in behaviour. Thus, appropriate packaging solutions need to be developed to ensure performance is maintained and the operating temperature of the light emitting device is maintained for a given change in the junction temperature as well as the ambient temperature.

The Thermal Resistance of a package is the measure of how well a package can conduct heat away from the junction of the LED. Present state-of-the-art modules have a thermal resistance of between 4 and 8 K/W.

Many methods have been successfully employed to improve the thermal resistance of LED module packages. These include the use of shaped metal lead frames in array formats, as described in U.S. Pat. No. 6,770,498, the use of bulk Aluminum Nitride ceramic tiles with electrical tracking on top, as described in U.S. Patent Application 2006/0091415A1, and the use of flip chip LEDs onto tracked ceramic tiles with through vias to allow surface mounting, as described in published U.S. Patent Application 2006/0091409A1.

Historically, LEDs were of the lateral type grown on either sapphire wafers or silicon carbide wafers, with both contacts located on the top of the LED by means of an etch through the p-n junction to the lower layer. A schematic of this type of LED is shown in FIG. 1. The LED 112 consists of a sapphire substrate 102 upon which has been grown a layer of n-doped semiconductor such as Gallium Nitride. The electrical contact and wire bond pad 109 is in contact with this n-doped semiconductor and forms the n contact to the p-n junction 104. The p-type semiconductor 105 is in contact with the top transparent contact layer 105, which in turn is in contact with 107 the metal wire bond pad. The LED 112 is attached to the metal carrier 100 by a solder of adhesive layer 101. The wire bonds 108 and 110 provide electrical paths from the p-contact (107) and the n-contact (109) to a PCB 111. Thus, the electrical paths are insulated from the metal carrier 100.

The metal carrier can also be an insulating metal core printed circuit board (IMS-PCB) with built-in electrical isolation, removing the need for PCB 111. The lateral chip has a sapphire substrate which provides electrical isolation between the thermal path and the package. This is a desirable feature as it allows simplification of the packaging allowing the chip to be mounted directly on a electrically and thermally conducting material, such as a metal substrate or heat-sink, without it being electrically live. This is particularly important when high DC or AC voltages are present and for safety reasons in the event of driver failure or short circuit. The thermal performance of this kind of LED grown on a sapphire wafer is poor as the thermal conductivity of sapphire is low at 40 W/(m·K) and the wafer is typically thick at 0.4 mm, thus creating a large thermal resistance path as high as 18 K/W. Many manufacturers actually thin the sapphire substrate wafer after processing (by methods such as lapping and polishing) in order to minimise the thermal resistance.

Although the above steps help to improve thermal dissipation, when such LED devices are driven at more than 0.5 W electrical drive power, they show a marked drop in efficiency due to elevated p-n junction temperatures associated with heat build-up in the chip. Another issue related to this kind of chip is the current crowding between and around the contacts 109 and 107 and their associated below optimum current injection into the complete light emitting area 104, all of which leads to further reduced efficiency. In addition, the light extraction can also be affected by such a lateral LED design due to the large percentage overlap between the optically lossy contact areas and the optical modes trapped in the LED semiconductor material, as well as the trapped optical modes residing in the sapphire substrate 102.

In recent years the LEDs themselves have been engineered to produce a low thermal resistance path from the junction to the package where the heat is spread by methods such as the flip-chip approach described above (published U.S. Patent Application 2006/0091409A1), where the junction is very close to the package. Another approach to allow LEDs high current and thermal driving capabilities to work efficiently is the vertical type n-p contact configuration. A vertical type structure is where the n and p contacts are at the top and bottom of the chip. GaN LED vertical LEDs have been disclosed in U.S. Pat. No. 6,884,646 and published U.S. Patent application No. 20060154389A1. Such devices use high thermal conductivity materials, for example Copper, to provide low thermal resistance from the junction to the package.

Vertical type chips have the advantage of excellent thermal performance but at the expense of electrical isolation from the packaging. To achieve this electrical isolation from the packaging, elaborate ceramic submounts and materials are needed. All of these introduce additional parts, assembly complexity, cost and additional thermal interfaces.

We now consider in some detail some existing approaches to packaging using insulated metal core printed circuit boards.

The use of insulated metal substrate printed circuit boards (IMS-PCB) are common place and are as described in U.S. Pat. No. 4,810,563. These are used in many applications including LEDs. They allow the thermal path to be electrically isolated from the electrical contacts of the LED and consist of a metal substrate, commonly Aluminum or copper, and range in thickness between 0.5 mm and 3.2 mm. On top of the substrate is an adhesive layer typically consisting of particulate loaded epoxy. The particulates are chosen to increase the thermal conductivity and include Aluminum Nitride, Diamond and Beryllium Nitride. The next layer is an electrically insulating polyamide film. On top of this is an electrical circuit layer that usually consists of copper. The circuit layer has two functions, one is heat spreading and the other is to provide the electrical circuit layout for the application. On top of this is an insulator to prevent surface short circuits and corrosion.

Typically, to get the required electrical isolation (kilovolts) using a polyamide material, a 75 micron thick sheet is needed. For this, the thermal conductivity is only 2.2 W/(m·K). Such a level is adequate for power electronics where thermal load densities are of the order of Watts/cm$^2$ and is a significant improvement in performance above FR4 circuit boards. However, if this type of IMS-PCB is used with the LED placed directly on the PCB, then high junction temperatures will occur, as the thermal load will not be able to spread adequately in the copper circuit layer.

The IMS-PCB is widely used in the LED packaging industry, as it can be used to mount ceramic packages which perform the function of heat spreading and thereby make the thermal load equivalent to that of power electronics. In addition to this advantage, the IMS-PCB can be machined with holes to allow mechanical attachment to a heat sink.

Of course, all these layers of packaging create extra cost and extra interfaces that increase thermal resistance. The best LEDs packaged in ceramic modules on IMS-PCBs provide a thermal resistance of about 8 K/W from the junction to the base of the module. An LED packaged in this way is shown in FIG. 2. The metal substrate 201 has the adhesive layer 202 attaching a polyamide electrical insulation layer 203. On top of this is the metal circuit tracking layer 204. This assembly, 201, 202, 203 and 204, is the IMS-PCB 221.

On top of this is soldered or bonded using layer 205 the electrically insulating but thermally conducting ceramic tile 214, with the LED 212 attached by a solder or adhesive layer 213. The ceramic tile, 214, can be any number of ceramics such as alumina or aluminium nitride. The top electrical connection from the LED 212 to the electrical circuit layer 208 on the top of the ceramic tile (214) is via a wire bond 211. The electrical circuit layer 208 is in electrical contact with the bottom electrical circuit layer 206 through the use of an electrical via 207. The bottom electrical contact of the LED 212 is in electrical contact with the top electrical contact 215 of the ceramic tile through the use of a solder joint 213. This in turn is in electrical contact with the bottom side 217 of the ceramic tile 214 through the use of an additional electrical via or vias 216.

The use of the thermally conductive ceramic tile 214 ensures that the large bottom contact 220 acts as the thermal path to the IMS PCB 221, but there is no electrical connection as no electrical vias are used in this section of the ceramic tile 214. Thus, the top electrical contact to the LED and the bottom electrical contact to the LED are separated through the use of the IMS PCB 221, and any heat sink attached to the bottom side of the IMS PCB 221 is electrically isolated. This is an important issue when typical metal, graphite or conductive plastic heat sinks are used to prevent the heat sink becoming electrically live. The LED 212 is encapsulated with a non conducting epoxy or silicone encapsulant 210, held in a cup or receptacle 209 to allow good light extraction. Lenses are often used in addition, although this is not depicted here, as this is not pertinent to the present invention. The use of a ceramic tile provides for a smooth surface for attaching the LED. With LED solder joints being as thin as 3 μm (gold tin solders) the surface morphology of the ceramic tile should be similar By cutting into the metal core of the IMS PCB and soldering a ceramic tile in direct contact with the core of the board the thermal resistance can be reduced. The best LEDs packaged using Aluminum Nitride ceramic tiles soldered into the core of the IMS PCB offer thermal resistance of 4 K/W from the junction to the base of the modules.

An LED packaged in this way is shown in FIG. 3. The metal substrate 301 has the adhesive layer 302 attaching a polyamide electrical insulation layer 303. On top of this is the metal circuit tracking layer 304. This assembly, 301, 302, 303 and 304, is the IMS-PCB 316. The electrical tracking of the IMS-PCB 316 and the electrical circuit layer 306 of the ceramic tile 317 are electrically connected to together through the use of wire bonds 305. The ceramic tile, 317, can be any number of ceramics such as alumina or aluminium nitride although aluminium nitride is preferred due to its high thermal conductivity. The top electrical connection from the LED (309) to the electrical circuit layer 306 on the top of the ceramic tile (317) is via a wire bond 307. The bottom electrical contact of the LED 309 is in electrical contact with the top electrical contact 312 of the ceramic tile through the use of a solder joint 308.

Again, the use of the thermally conductive ceramic tile 317 ensures that there is a low resistance thermal path to the metal substrate 301. Thus the top electrical contact to the LED and the bottom electrical contact to the LED are separated through the used of the IMS PCB 316 and any heat sink attached to the bottom side of the IMS PCB 316 is electrically isolated through the use of the ceramic tile 317. This is an important issue if typical metal, graphite or conductive plastic heat sinks are used to prevent the heat sink becoming electrically live. The LED (309) is encapsulated with a suitable encapsulant such non conducting epoxy or silicone encapsulant 310, held in a cup or receptacle 311 to allow good light extraction. Lenses are often used in addition, although this is not depicted here as this is not the focus of this invention.

Additionally, it has recently been proposed that the LED chip can be segmented into electrically isolated LED cells, which can be wired up through wafer level electrical tracking to allow the chip to be driven directly off mains AC current (either 240 V or 120 V). It is well known in the prior art, for example U.S. Pat. No. 7,210,819 B2, that connecting up arrays of lateral LED chips in series using wire bonds or electrical tracking can allow direct AC operation at either 240 or 110 AC without the need for a DC driver chip. However, due to the high packing density of the LED cells the thermal dissipation adversely affects the efficient driving of such an AC LED device.

As will be appreciated, despite the various advancements in the field, there is still a need for an improved light emitting device with good electrical and thermal performance, together with a simplified packaging process.

SUMMARY OF THE INVENTION

According to a first aspect of the present invention, a light emitting device comprising the following layers:
  a first semiconductor layer with doping of the first type;
  a second semiconductor layer with doping of the second type;
  a light emitting region interdisposed between first and second semiconductor layer;
  an electrical conducting mirror layer disposed proximal to the first semiconductor layer and distal to the second semiconductor layer;
  a deposited isolation layer disposed proximal to the electrical conducting mirror layer and distal to the first semiconductor layer, the isolation layer having electrical insulating properties and thermal conducting properties;
  a first electrode disposed on the electrical conducting mirror; and
  a second electrode disposed on the second semiconductor layer,
wherein:
  light generated in the light emitting region is extracted from a surface of the second semiconductor layer;
  the electrical conducting mirror layer at least partially extends across a surface of the first semiconductor layer and at least 60% of light generated in the light emitting region and incident on the electrical conducting mirror layer is reflected; and,
  the first electrode is not in contact with the first or the second semiconductor layer.

The present invention thus combines the electrical isolation advantage of lateral light emitting devices with the thermal and electrical current drive performance of the vertical type light emitting devices. The present invention electrically isolates a light emitting device with a vertical current path at the semiconductor wafer level processing step thus allowing for a simplification of the light emitting module packaging used for high brightness light emitting devices which also ultimately leads to reduced cost. This electrically isolated vertical LED (EIVL) approach has many other advantages as will be described.

Preferably, the high thermal and high electrical conductivity paths are separated during the semiconductor wafer and die level in order to achieve efficient operation in the light emitting module.

Preferably, the present invention the light emitting device also includes a first deposited buffer layer having thermally conductive properties to aid adhesion and which is disposed proximal to the first deposited layer and distal to the electrical conducting mirror layer.

The light emitting device may additionally include a second deposited buffer layer having thermally conductive properties to aid adhesion and which is disposed proximal to the first deposited buffer layer and distal to the first deposited layer.

The first and second deposited buffer layer may include, but not restricted to, the following materials: metals, semiconductors, metal oxides, metal nitrides, dielectrics, polymer, hydrocarbons, epoxies, resins or mixtures and multilayers thereof.

Preferably, the deposited isolation layer comprises an electrically insulating material with thermal conductivity greater than 130 W/(m·K). For example, the electrically insulating material may be selected from a group which includes Diamond-like Carbon, Silicon Nitride, Aluminum Oxide, Aluminum Nitride.

Preferably, the deposited isolation layer thickness is in the range of 50 nm to 50 micrometers.

The electrical conducting mirror layer may be selected from a group which includes a metal, a metal multilayer, a transparent conductive oxide, a transparent conductive nitride, an omni-directional reflector (ODR), a conductive multilayer reflector (CMR), and a multilayer reflector with embedded conductive via (CVMR).

According to a second aspect of the present invention, a light emitting module comprises:
  a light emitting device according to the first aspect;
  a substrate with high thermal conductivity properties;
  a die attach layer interspaced between the light emitting device and the substrate for providing physical attachment;
  a circuit layout board residing on surface of the substrate; and,
  at least one electrical connector connecting the first electrode to the circuit layout board and at least another electrical connector connecting the second electrode to the circuit layout board, the electrical connectors providing a path for electrical current flow,
  wherein the light emitting device is electrically isolated from the substrate.

According to a third aspect of the present invention, a light emitting module comprises:
  a light emitting device according to the first aspect;
  a substrate with high thermal conductivity properties;
  a die attach layer interspaced between the light emitting device and the substrate for providing physical attachment;
  a circuit layout board residing on a surface of the substrate;
  electrical tracking partially disposed on the light emitting device; and,
  at least one electrical connector connecting the electrical tracking to the circuit layout board and at least another electrical connector connecting the first electrode to the circuit layout board, the electrical connectors providing a path for electrical current flow,
  wherein the light emitting device is electrically isolated from the substrate.

According to a fourth aspect of the present invention, a light emitting module comprises:
- a plurality light emitting devices, each light emitting device according to the first aspect;
- a substrate with high thermal conductivity properties;
- a die attach layer interspaced between the plurality of light emitting devices and the substrate for providing physical attachment;
- a circuit layout board residing on a surface of the substrate; and,
- electrical tracking partially disposed on the plurality of light emitting devices, wherein:
- the plurality of light emitting devices are arranged on the substrate;
- the plurality of light emitting devices are electrically isolated from the substrate; and,
- at least one first electrode of at least one of the light emitting devices is connected to at least one second electrode of another of the light emitting devices to provide internal electrical connectivity between the light emitting devices.

In the light emitting modules of the present invention, the light emitting devices provide a greatly enhanced luminous efficiency and greater drive current capability through the use of the electrically isolated vertical structure with its superior thermal performance and greatly reduced packaging.

Preferably, the electrical tracking between light emitting devices in the light emitting module is defined by a means such as a lift-off process with the metal tracking deposited, sputtered or evaporated.

The substrate may comprise a material selected from a group which includes metal, multilayer of metal, metal alloys, IMS-PCB and High Thermal Path IMS PCB.

The die attach layer is important for providing the necessary physical attachment between the light emitting devices and the substrate. Any suitable material may be used. For example, the die attach layer may comprise a solder layer, which is formed using solder selected from a group which includes eutectic solder, solder alloy, solder pre-form and solder paste. Alternatively, the die attach layer may comprise a material selected from a group which includes epoxy adhesive, resin, thermoplastic, and silver glass. In addition, all materials may be in-filled to improve thermal and/or electrical conductivity.

In one embodiment the circuit layout board is a PCB, in which case the circuit layout board of the light emitting module may comprise a low cost standard PCB bonded to the metal substrate.

According to a fifth aspect of the present invention, a light emitting system comprises:
- an alternating input current; and,
- a light emitting module according to the fourth aspect, wherein the electrical connectors of the light emitting devices, the electrical tracking and the circuit are configured to couple the alternating input current to the plurality of light emitting devices which thereby generate light.

According to a sixth aspect of the present invention, a light emitting projection system comprises:
- a light emitting module or a light emitting system according to the present invention;
- a reflector cup attached to the substrate that is at least partially reflecting for light emitted from the one or more light emitting devices; and,
- encapsulation disposed around the one or more light emitting devices and confined by the reflector cup.

Preferably, the projection system comprises at least one secondary optical element. The secondary optical element may be selected from a group which includes a lens and diffractive optical element.

The encapsulation may comprise any suitable encapsulant, including resins, epoxies, PMMA, polymers, Silicones and inorganic materials. It is preferred that at least a part of the encapsulation comprises an embedded Phosphor. The Phosphor may comprise of single or multiple component materials. This increased refractive index of the encapsulant can be used for improved light extraction out of the light emitting device.

According to a seventh aspect of the present invention, a method of manufacture of a light emitting device, a light emitting module, a light emitting system or a light emitting projection of the present invention, comprises the step of depositing by an evaporation and/or sputtering technique at least one of the isolation layer, the first buffer layer, and the second buffer layer. The evaporation and/or sputtering technique may be selected from a group which includes Plasma assisted or enhanced deposition, Ion Beam assisted deposition, electron beam assisted deposition, Remote Plasma assisted deposition, open and closed field magnetron sputtering.

As will be appreciated by the skilled person, the present invention provides a means of allowing efficient continuous high power injection into a small format semiconductor light emitting device while ensuring that the semiconductor light emitting junction is maintained at a constant low temperature providing for maximum efficiency and the longest operating lifetimes. The light emitting module of the present invention allows the heat to be rapidly conducted away from the light emitting device through a high thermal conducting but electrically isolated substrate heat sink. As such, the invention allows the thermal resistance of the light emitting module to be reduced to below 0.5 K/W, when substrate materials such as, but not restricted to, metals, high performance ceramics or High Thermal Path (HTP) IMS-PCBs are used.

BRIEF DESCRIPTION OF THE DRAWINGS

Examples of the present invention will now be described in detail with reference to the accompanying drawings, in which.

DETAILED DESCRIPTION

Figure 1:
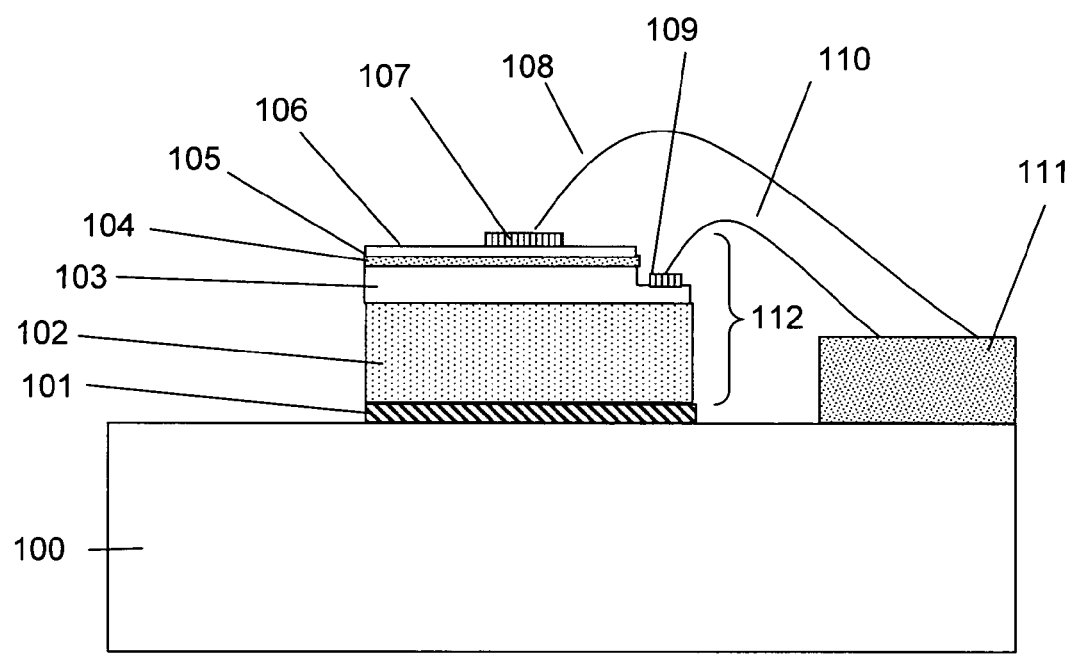
FIG. 1 (prior art) shows a cross section of a known lateral LED mounted on a metal substrate with a separate PCB.
Figure 2:
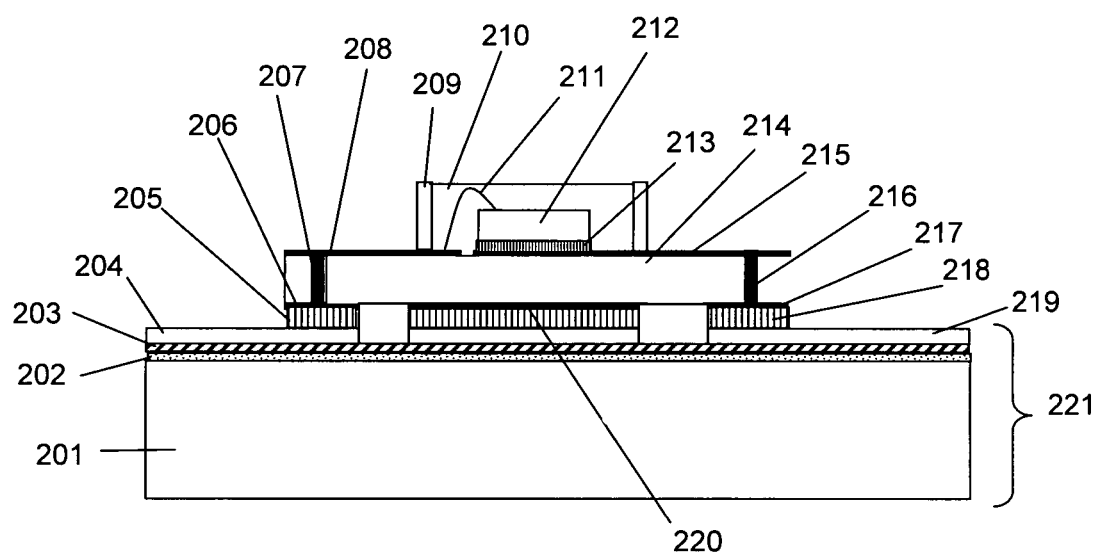
FIG. 2 (prior art) shows a cross section of a known LED package where the LED is mounted on a ceramic tile with conductive vias which also attach to a IMS-PCB.
Figure 3:
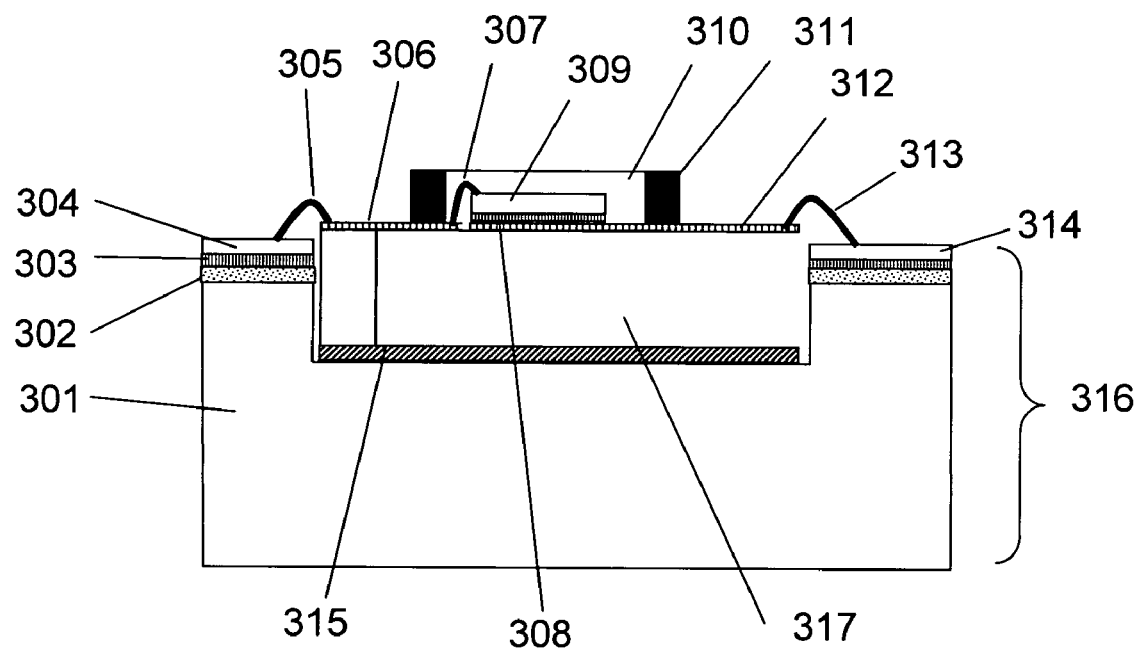
FIG. 3 (prior art) shows a cross section of a known LED package the LED is mounted on a ceramic tile which is mounted in direct thermal contact with the core of an IMS-PCB.

A key objective of the present invention is to provide a high luminous output semiconductor light emitting device while still maintaining high wall plug efficiency. The invention can be incorporated in a light emitting device based on any semiconductor material system. Examples of suitable semiconductor material systems include InGaN, InGaP, InGaAs, InP, or ZnO, but are not restricted to these. To illustrate the invention, a GaN based light emitting diode (LED) having an epitaxial layer formed on a sapphire substrate is used as an example. However, the application of the present invention is also not restricted to epitaxial layers grown on sapphire, and may include Si, SiC, Ge, native free-standing GaN, AlN, LiAlO or any other growth and substrate technology.

Another object of the invention is to make use of LEDs having a vertical current path, where the electrical current through the p- and n-doped materials is applied through substantially parallel contacts that allow the current to flow in a vertical direction of the LED structure. Such LED structures are sometimes also described as thin film, thin GaN or free standing GaN LEDs.

In order to put the invention in context, we first consider thermal conduction and thermal properties of materials commonly used. The thermal conductivity of a material can be defined as follows:

$$k = \frac{Q}{t} \times \frac{L}{A \times \Delta T} \quad (1)$$

where Q is the quantity of heat transmitted in time t through a thickness L in a direction normal to a surface of area A, as the result of a temperature difference ΔT. Moreover, this expression applies under steady state conditions and when the heat transfer is dependent only on the temperature gradient.

In order to reduce the temperature difference across a defined region in a package a material with a higher thermal conductivity can be employed, additionally a thinner material may also be implemented. However, care must be taken that, when reducing the thickness, good electrical insulation and high electrical breakdown voltages are maintained. Table 1 contains a list of the thermal conductivity and the coefficient of thermal expansion (CTE) for a number of materials commonly used in semiconductors, light emitting devices, and LED packaging.

The thermal resistance of a material is the inverse of the thermal conductivity of the material. An LED comprising purely of free standing or thin GaN materials will possess a thermal conductivity of between 130 to 225 W/(m·K). In order to maintain the low thermal resistance in the EIVL LED of the present invention, the thermal resistivity of the materials residing in the light emitting device must not exceed that of the GaN.

As electrical current is injected into the p-n junction of a semiconductor device, heat is generated in the vicinity of the light emitting region. Increasing the thermal resistivity of specific layers in the light emitting device or EIVL-LED will hinder the heat dissipation away from the light emitting region. The increased heat would reduce the internal quantum efficiency of the light emitting region thus emitting less light and affecting the overall efficiency of the light emitting device.

TABLE 1

| Material | Thermal Conductivity W/(m · K) | CTE ($10^{-6}$/K) @ 20° C. |
| --- | --- | --- |
| Alumina | 18 | 6.9 |
| Aluminum Nitride | 170 | 4.7 |
| AuSn solder | 57 | 16 |
| Copper | 400 | 17 |
| Aluminium | 237 | 24 |
| Tungsten | 160 | 4.3 |
| Silver | 419 | 18 |
| Gold | 318 | 14 |
| GaN | 130-225 | 3.1 |
| Sapphire | 40 | 8.4 |
| Silicon | 150 | 2.6 |
| Diamond | 900-1900 | 1.18 |

If Table 1 is examined, the preferred material for incorporation into an LED package would comprise of a diamond heat spreader and heat sink. However, the cost for this would be prohibitively high for general lighting applications.

Table 1 also contains the coefficient of thermal expansion (CTE) for the same materials. Ensuring good matches between the submount materials and the semiconductor light emitting device eliminates stress build up during soldering. This in turn will improve the overall reliability of the light emitting module when high power densities are injected into the LED or laser diode device.

Stress can also be managed through the use of adhesion and buffering layers that have CTE coefficients residing between those of the materials being buffered. For example, an adhesion and buffering layer may be deposited between underlying substrate and the deposited high thermal conductivity layer. This is an important factor in joining materials of different CTE in order to improve reliability.

Another important factor in the performance of a light emitting module, which comprises an LED and underlying submount, is the implementation of electrical isolation between the light emitting diode and the submount. Typically, submounts are selected from metal alloy materials for improved thermal conductivity. However, these materials also exhibit high electrical conductivity, and hence introduce unwanted electrical leakage into the submount and package when used in conjunction with vertical type LEDs. Therefore, it is an object of the present EIVL LED to provide a high thermal conductivity light emitting device that also benefits from electrical isolation.

In a main aspect of the present invention the high thermal and high electrical conductivity paths are separated during the semiconductor wafer and die level manufacturing step in order to achieve efficient operation in the light emitting module.

The light emitting device comprises an n-doped GaN semiconductor material, a p-doped GaN material and a Quantum Well (QW) region residing between them. In one example of the vertical light emitting device, an electrically conducting mirror layer is disposed under the p-doped material in order to allow the light emitted from the QW region to be reflected and extracted from the top surface of the n-doped material. The light emitting device geometry allows the electrical current to vertically flow from the n-type electrode residing on the top surface of the n-doped semiconductor material through to the electrically conducting mirror layer which also acts as the p-type electrode.

In the present invention a novel deposited electrical isolation layer is introduced, which is disposed under the electrically conducting mirror layer. The p-electrode is defined on the electrical mirror and is not in physical contact with the p-doped semiconductor region, thereby achieving maximal current spreading and cross section overlap across the surface of the p-doped semiconductor region. This allows for true vertical current injection across the light emitting device. The novel deposited electrical isolation layer is selected to also benefit from high thermal conductivity, and thereby allow the light emitting device to both be connected directly to a metal substrate or heat sink without electrical leakage while still allowing efficient thermal dissipation. It is important to note that the doping of the semiconductor layers can be interchanged (i.e. the n-doped layer can be interchanged with a p-doped layer) without detracting from the main aspect of the present invention.

Figure 4A:
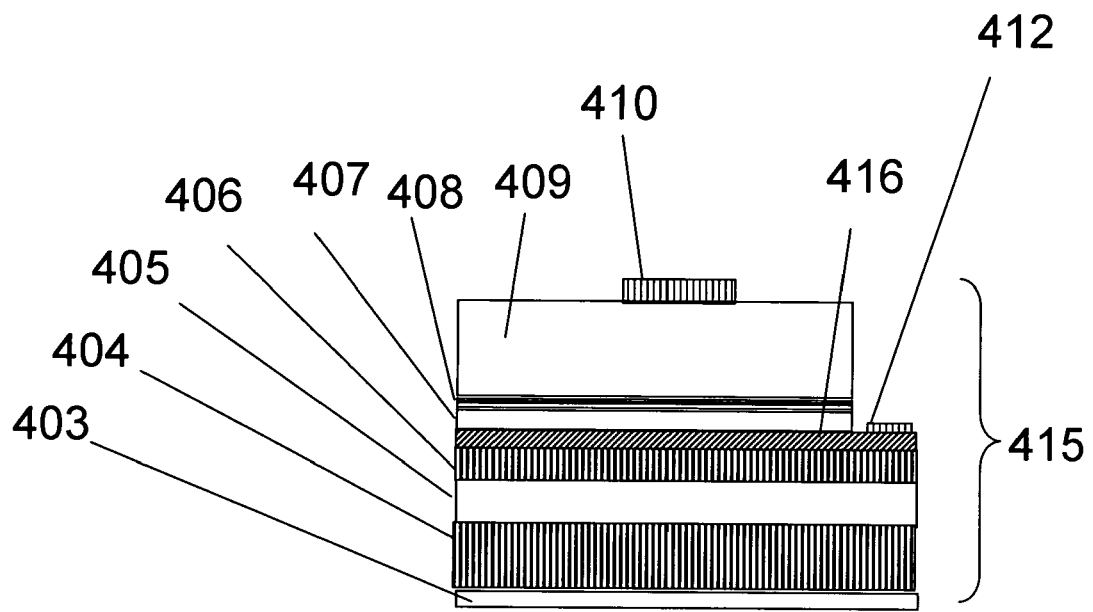
FIG. 4a shows a cross section of a light emitting device of the present invention.

An EIVL light emitting device, 415, of the present invention is shown in FIG. 4a. The vertical light emitting diode (LED) has a light emitting region 408 comprising (but not restricted to) a multiple quantum well sandwiched between an n-doped layer 409 and p-doped semiconductor layer 407. The n-doped region 409 is typically 1, 2, or 3 microns thick, although can be significantly thicker to provide the chip with mechanical support as well as improved electrical current spreading. The top n-electrode 410 resides on the n-doped semiconductor surface. Part of the electrode can comprise of a partial or complete overcoat of the layer 409 with an optically transparent conductive metal oxide or nitride, a metal layer or combinations thereof, in order to create a low loss top contact. This top n-electrode contact can be designed to comprise of an omni-directional reflector (ODR), a distributed Bragg Reflector (DBR), a conductive reflective multilayer stack or an optically reflective multilayer stack with electrically conductive via elements. The LED layers 407, 408 and 409 are typically isolated from environmental factors with a passivation layer such as, but not restricted to, Silicon Oxide, Silicon Nitride, or Zirconium Oxide. This layer is not shown in FIG. 4a so as not to distract from the main aspect of the present invention.

Layer 407 resides on top of an electrically conducting mirror layer 416. Layer 416 at least partially extends along the surface of the p-doped semiconductor layer 407 and also extends further out. The optical properties of the mirror are designed to allow at least 60%, but preferably 70%, 80%, 90%, or 95% of the light incident on layer 408 to reflect. The optical reflectivity spectrum is designed to efficiently overlap the emission wavelength of the light emitting region for all incidence angles and for all polarisations across the complete emission bandwidth of the EIVL LED. The layer 416 can comprise of complex layers and arbitrary shaped vias to allow for optimal reflectivity. Metal and transparent conducting metal oxides and nitrides comprising, but not restricted to, Ag, Al, ITO, and Al-doped ZnO (AZO) may be used in the multilayer stack to improve both optical reflectivity and electrical conductivity. Layer 416, may also be designed to operate as an omni-directional reflector (ODR), distributed Bragg Reflector (DBR), conductive reflective multilayer stack or an optically reflective multilayer stack with electrically conductive via elements. It is an object of the present invention that layer 416 is designed with layers comprising materials having a high thermal conductivity such as, but not limited to, the materials listed in Table 1. If layers of lower thermal conductivity are used, the thickness of the layer is minimised to maintain performance.

In a preferred example of the present invention, the electrical conducting mirror is increased in thickness with a metal deposited by a technique such as, but not limited to, electrodeposition or low temperature sputtering or evaporation. This gives the EIVL LED extra rigidity and handling strength.

The p-doped semiconductor layer 407 thickness may be optimised to allow for improved light extraction effects by use of optical cavity effects, whereby light emitted from the quantum well region and light reflected from the electrical conducting mirror 416 constructively interfere to enhance light extraction.

A region of the top surface of the electrically conducting mirror layer 416 is exposed to allow electrical contacting. This region may be removed by etching through the layers 409, 408 and 407 to expose the mirror layer 416. Standard semiconductor etching techniques may be employed for this process, such as dry etching using ICP or RIE, or wet etching using chemicals such as KOH. Subsequently, a wire bondable surface to connect to the conductive mirror structure 412 is formed.

A deposited buffer layer 406 provides adhesion and stress relief between the electrically isolating deposited layer 405 and the electrically conducting mirror 416.

The deposited electrically insulating layer 405 of the present invention can be a single layer or multiple layers of dielectrics deposited at a controlled temperature and stress. In a preferred example of the present invention, the materials for the deposited isolation layer are diamond-like carbon (DLC) and Aluminum Nitride, as these have high thermal conductivity and high dielectric strength values. Thin (150 nm) DLC layers have thermal conductivities in excess of 1000 W/(m·K). Low temperature, high quality dense films can achieve electrical isolation of greater than 1 kV, or greater than 2 kV. Thin layers of Aluminum Nitride, of approximately 1-3 microns thickness, can exhibit electrical isolation in excess of 1 kV while achieving thermal conductivities of greater than 40 W/(m·K), greater than 170 W/(m·K) or even greater than 200 W/(m·K).

Advances in low temperature deposition technology, such as Plasma assisted or enhanced deposition, Ion Beam assisted deposition, electron beam assisted deposition, Remote Plasma assisted deposition, open and closed field magnetron sputtering, allow materials to be deposited with controlled stress and high deposition rates (typically nanometers per minute) at temperatures near to room temperature. Lower temperatures are possible through the use of cryogenically cooled substrates, and higher temperatures through the use of heated substrates. These novel techniques allow materials to be deposited with near bulk dense material properties and high mechanical integrity. As a result, the deposited isolation layers can be put down at low and controlled temperatures with very high adhesion at rates greater than 40 nm/min.

It is noted that solder processes used to attach the EIVL LED die to the substrate may build up stress, which will be locked in at the solder hardening point (as high as 300° C.). Therefore, in one aspect of the present invention, the inclusion of controlled stress layers by the use of the above mentioned deposition techniques (controlled temperature deposition) additionally allows stress to be appropriately managed within the layers of the package to minimise the build up of stress at the operating temperature of the EIVL LED.

In preferred examples of the invention, the layer 405 has a thickness of at least 50 nm, 100 nm, 150 nm, 250 nm, 500 nm, 1 micron, 2 micron, 5 micron or 10's of microns in thickness. It is also preferred that the rate of deposition of layer 405 is approximately at least 10 nm/min, 20 nm/min, 40 nm/min or 100 nm/min. In the same preferred example, the breakdown voltage of layer 405 is at least 0.5 kV, 1 kV, 1.5 kV or 2 kV.

Other materials that can be used include non-conducting oxides and non-conducting nitrides of metals and semiconductors, including mixtures and multilayers of these materials. Layer 405 can be of any thickness between 50 nanometers and several tens of microns, provided that it does not introduce a high thermal resistance and that is does provide adequate electrical isolation for the application. In practice, deposition rates and times will be a limiting factor in the overall thickness that layer 405 can achieve. However, it is an object of the present invention that the formation of stress and cracking associated with putting down these films, using conventional PECVD or other high temperature deposition techniques, is eliminated. It is also an aim of the present invention that the electrical isolation layers are integrated in the light emitting device during the wafer processing steps, thereby dramatically simplifying and reducing the cost of the overall cost of the packaging steps.

It is a further object of the present invention that the use of the above mentioned low temperature deposition techniques allows for the deposition of smooth layers having a variation in root mean square thickness of less than 5%, 3%, 1%, 0.5%, and even 0.1%. This is beneficial, as it allowa for improved smooth adhesion surfaces. It is another object of the present invention that use of the deposition techniques described above allows for in-situ plasma ashing of the chip surface prior to deposition of layers such as 405, and hence additionally improves surface adhesion and film integrity.

An additional deposited buffer layer 404 provides a stress buffer between layers 402 and 405, with the coefficient of thermal expansion (CTE) of the buffer layer being between that of layers 402 and 405, and the thermal conductivity being relatively high. Ideally, the thermal conductivity is greater than 40 W/(m·K) and even greater than 130 W(m·K). Layer 404 can be a single layer or a multilayer stack of materials consisting of metals, dielectrics and semiconductors, which are deposited using low temperature sputtering or evaporation or other suitable technique.

Figure 4B:
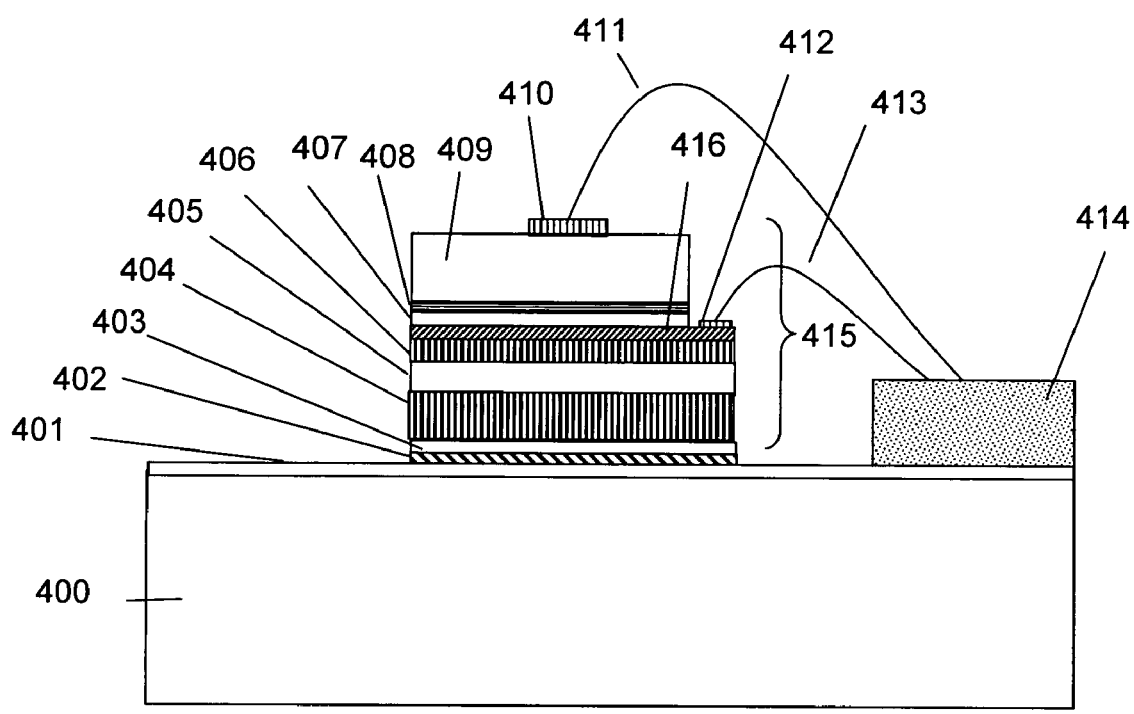
FIG. 4b shows a cross section of an embodiment of a light emitting module of the present invention, having a light emitting device with simplified packaging where the chip being mounted directly on to the metal substrate being electrically isolated from the substrate with a separate PCB.

FIG. 4b shows an example of a light emitting module of the present invention comprising a light emitting device of the present invention (as shown in FIG. 4a) attached to substrate, 400, having a high thermal conductivity properties. In a preferred example substrate 400 is a metal substrate, which can be any metal or alloy that has high thermal conductivity in excess of at least 130 W/(m·K). Suitable materials include, but not restricted to, Copper, alloys of Copper, Copper Tungsten, Aluminum, and layers of conductive metals or layers of graphite.

Layer 401 provides adhesion between the substrate 400 and the solder layer (402) attaching the LED device (415) to the metal substrate 400. Layer 403 similarly provides adhesion and a solderable surface suitable for attaching the LED device (415) to the substrate 400. Layer 401 and layer 403 are metal adhesion layers designed to allow solderablity. This can be a single metal or a multilayer stack, which may include any of Ni, Ni—Au, Au, Cr, Ti, Cr—Au, Cr—Pt—Au, Ni—Ti—Al-Au, and Rt—Au, or indeed any other suitable metal or metal stack.

The materials in layer 404 are also chosen to manage the stress that arises between the metal substrate and the electrically insulating layer 405 during the solder attach or LED die bonding process. In addition layer 404 must be of sufficient thickness to prevent the solder layer 402 wicking up and shorting out the electrical isolation provided by layer 405. In a preferred example, layer 404 has a thickness which is a minimum of 10 microns, 30 microns, or 50 microns. The solder layer 402 may have a thickness of at least 1 micron or 2 micron and up to 5 microns and at most about 10 microns thick. Layer 404 may be significantly thicker, for example at least 100 microns or 150 microns thick, to provide mechanical support for the LED chip during processing at a wafer scale.

Wire bonds 413 and 411 connect the top n-electrode 410 and the p-electrode 412 of the light emitting device to a simple circuit board 414. As the electrical connections to 412 are through the electrically conducting mirror 416 and layers 406, the electrical resistance of metals residing in these layers is selected for good current spreading. In certain mirror design types it may be advantageous to make the electrical connection partially or completely to layer 406 to improve performance. In the light emitting device design of the present invention, the problems of current crowding, which are typically present in lateral LEDs, are avoided, and with the added benefit of a electrically isolated thermal path. In addition, the thermal resistance of the light emitting device is designed to be as low as a vertical type LED of the prior art. The thermal performance of a light emitting module in this way can be as low as 2.0K/W, 1.5K/W, 1.0K/W, or even 0.5 K/W.

Figure 5:
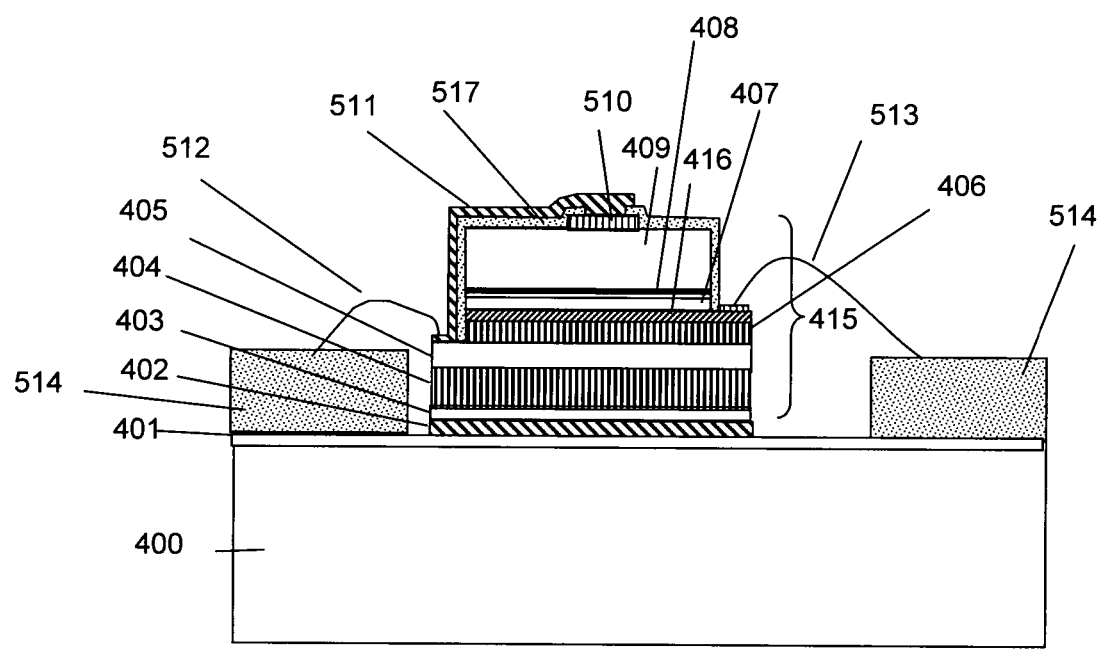
FIG. 5 shows a cross section of an embodiment of a light emitting module of the present invention, having a light emitting device incorporating electrical tracking to allow the relocation of the wire bond areas away from the light emitting region.

FIG. 5 shows another example of a light emitting module of the present invention, where the wire-bonds shown in FIGS. 4a and 4b are fully or partialy replaced with electrical tracking 511 that is partially disposed on the light emitting device 415. This has the advantage that the tracking 511 can re-locate the position of the wire bonds to where they are easiest to assemble and where minimum coverage of the top light extracting surface of the light emitting device is desired. Additionally, this allows the wire bonds 512 and 513 to be formed using wire bonding technique commonly used in microelectronic assembly, while still maintaining good light extraction efficiencies. Suitable materials include, but are not limited to Al wire bonds and Gold-Aluminum intermetallic compounds, for which wire bonds can be carried out at room temperature with low stress and using a larger contact area.

LED devices of the prior art use gold wire bonds in LED assembly, as the bond area is significantly smaller than that of Al wire bonds and hence occupies a smaller top surface emission area. However, gold (Au) wire bonds require the substrate to be preheated to greater than 100 Degrees centigrade to create the bond, while Al wire bonds are much more optically reflecting in at blue wavelengths than gold wirebonds. By employing the twin benefits of small contact area and high optical quality materials, electrical tracking can be formed from metals or transparent conductive oxides or multiple layers of these. To prevent short circuits the light emitting device must be passivated with a non-conductive dielectric material, such as silicon nitride, Silicon oxide, Zirconium oxide, Tantalum pentoxide or similar material. This is shown as 517 in FIG. 5.

Figure 6:
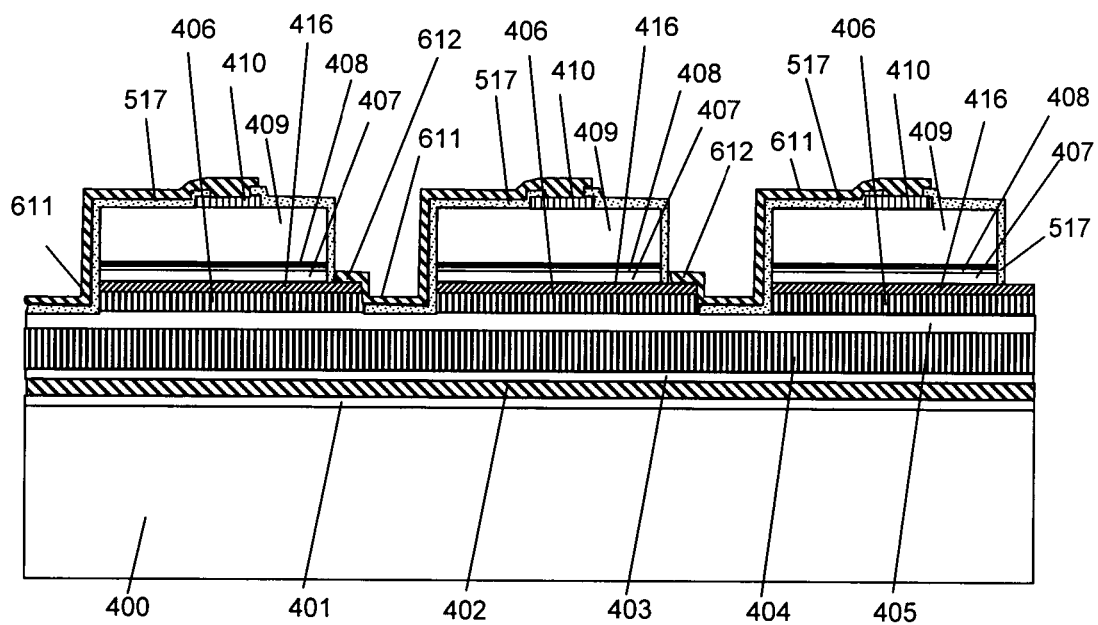
FIG. 6 shows a cross section of an embodiment of a light emitting system of the present invention comprising of a multiple array of light emitting devices with simplified packaging, where the light emitting devices are isolated from the substrate and connected electrically using tracking to allow series operation and the potential of direct or a.c. drive.

In another aspect of the present invention the light emitting system comprises a plurality of electrically isolated light emitting devices attached and arranged on a single carrier substrate with high thermal conductivity properties for high luminous intensity applications. An example of this is shown in FIG. 6, where the light emitting devices are connected in series and the electrical tracking 611 is disposed partially on at least one LED device. In this example the n-electrode 410 of the first LED is connected to the p-electrode region 612 of the second LED in series by use of the electrical tracking 611. The electrical tracking provides the advantage of minimising the coverage area on the top light emitting surface of the LED, when compared to traditional wire bonding, and hence improves the light extraction efficiency of individual LEDs.

Additionally, it is also an advantage that connecting approximately 3 to 4 light emitting devices in series, with approximately a 3V to 4V forward voltage across each LED, enables the light emitting module to be directly compatible for use with 12V d.c. transformers used in household general lighting applications.

In the present light emitting system, the passivation layer 517 is critical in maintaining the electrical isolation between at least part of the light emitting devices and the electrical tracking in order to eliminate any electrical shunting and shorting.

The electrical tracking 611 may comprise of metals, multilayers or metal or transparent conductive metal oxides and nitrides as well as doped semiconductors. Such materials include Ni, Cr, Pt, Al, Au, Ti, Rt, W, Cu, ITO, Al doped ZnO (AZO), In doped ZnO (IZO), Ga doped ZnO (GZO), and conductive polymer such as, but not restricted to, polyaniline or conductive block co-polymers. These materials can be deposited using many techniques, including sputtering, evaporation, electrodeposition, electroless deposition, CVD, Physical Vapour Deposition (PVD) and HVPE.

Figure 7A:
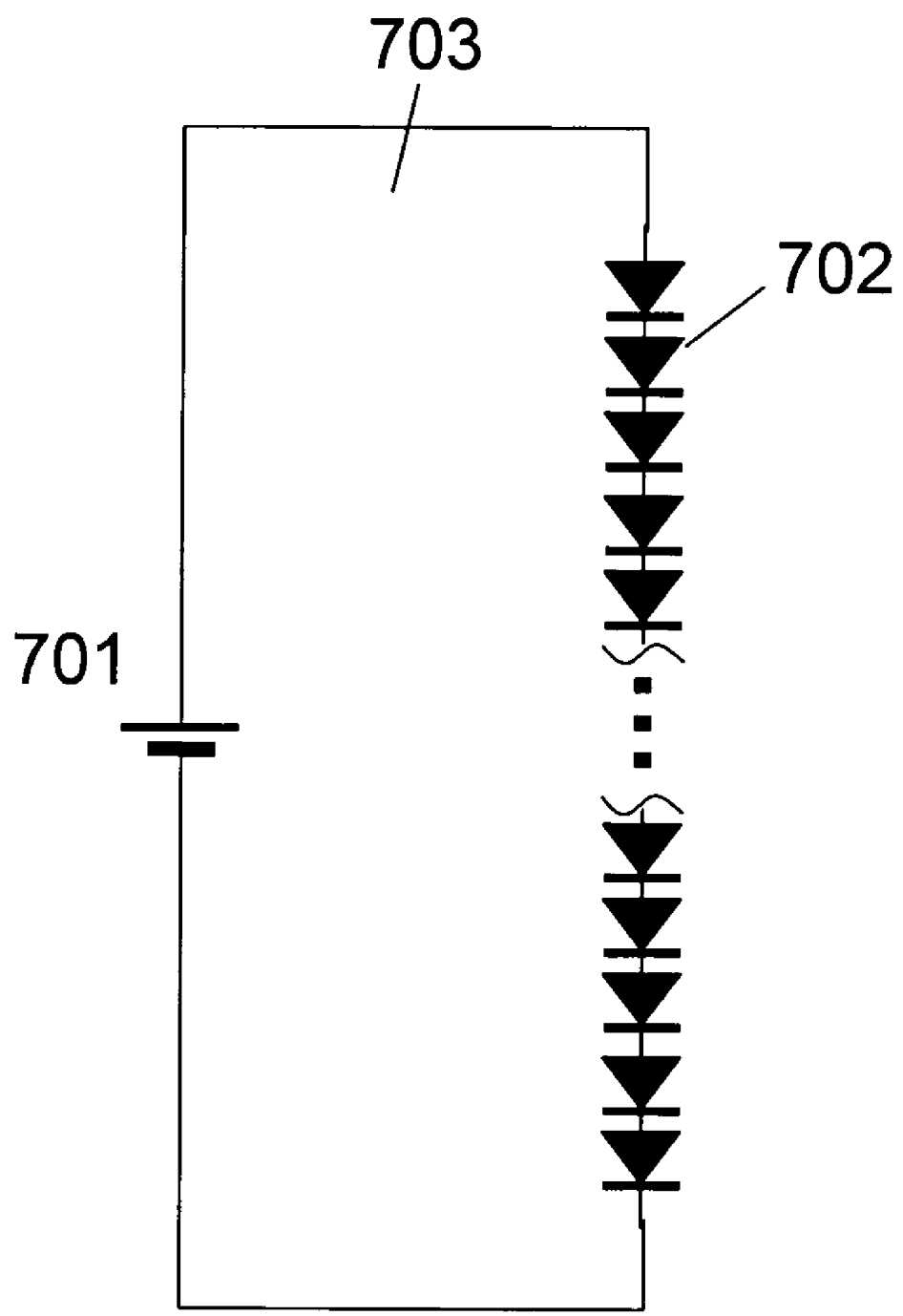
FIG. 7a shows a circuit layout of a set of light emitting devices mounted in a light emitting system wired in series.

The schematic circuit, 703, for a light emitting system proposed in the present invention is shown in FIG. 7a. The electrical connection between the isolated light emitting devices 702 within the light emitting module is typically in series, and hence can be driven using either a constant current source or alternatively a voltage source 701.

Figure 7B:
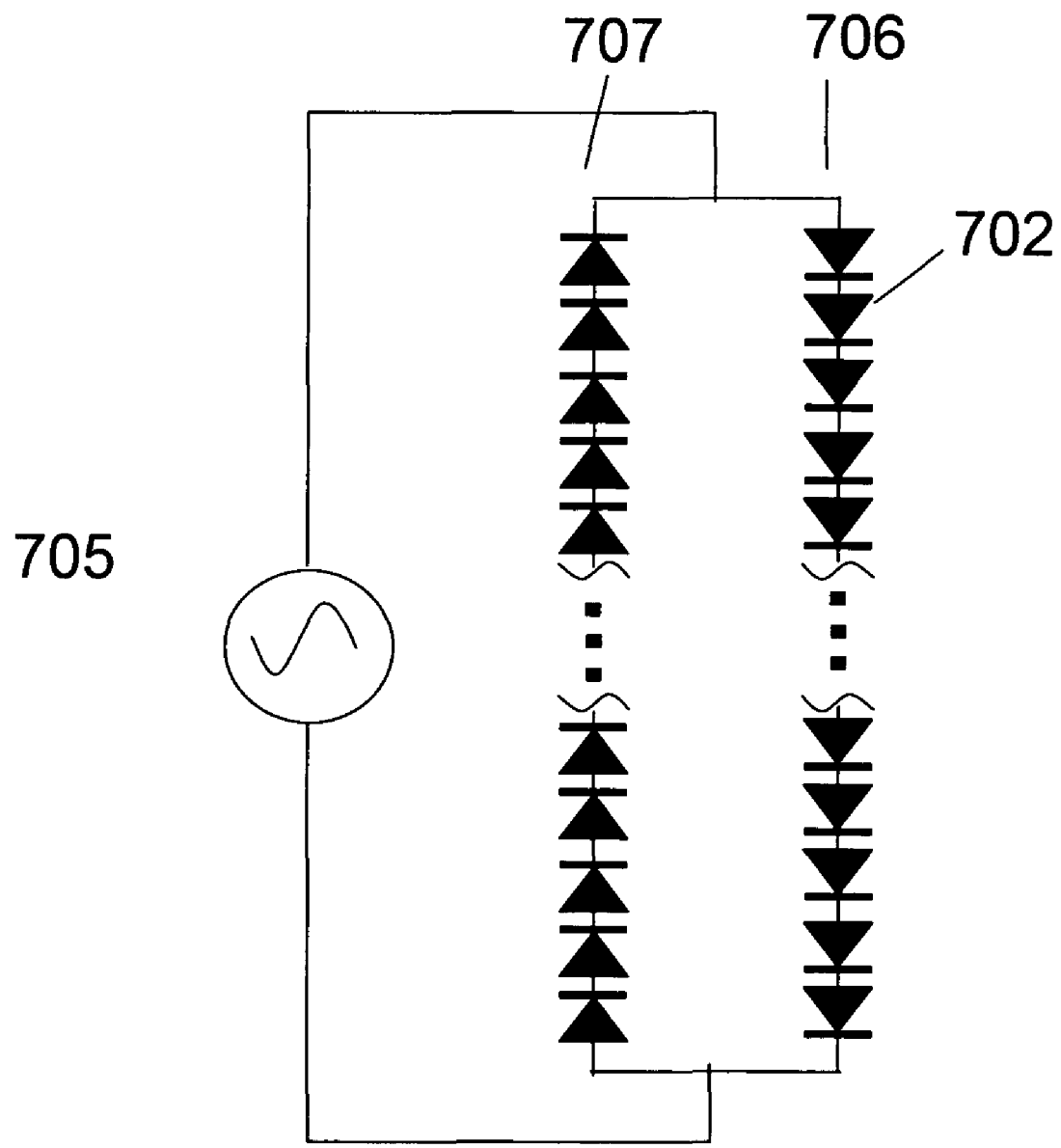
FIG. 7b shows a circuit layout with two branching sets of light emitting devices mounted in a light emitting system wired in parallel to allow direct a.c. drive.

Alternative electrical tracking between the light emitting devices in a single light emitting module can provide for more complex circuits, such as shown in FIG. 7b. Depending upon the desired drive power for each LED, approximately 30-40 LEDs 702 are connected in series in each arm, 706 and 707, of the circuit for an AC source 705 of 110 V. As such, a 240 V AC circuit will require correspondingly more LEDs connected in series. When the polarity of the alternating current is positive, current flows through one arm 706 of the circuit, and when the polarity of the alternating current is negative, current flows through the other arm 707 of the circuit. Thus, the light emitting system of the present invention can be directly driven by a.c. without the need for a separate driver circuit. Increasing the number of parallel branches in the circuit increases the permitted current flowing through the array of EIVL LEDs, thereby allowing for an increased luminous intensity while still maintaining a similar forward voltage drop across each branch.

Figure 8A:
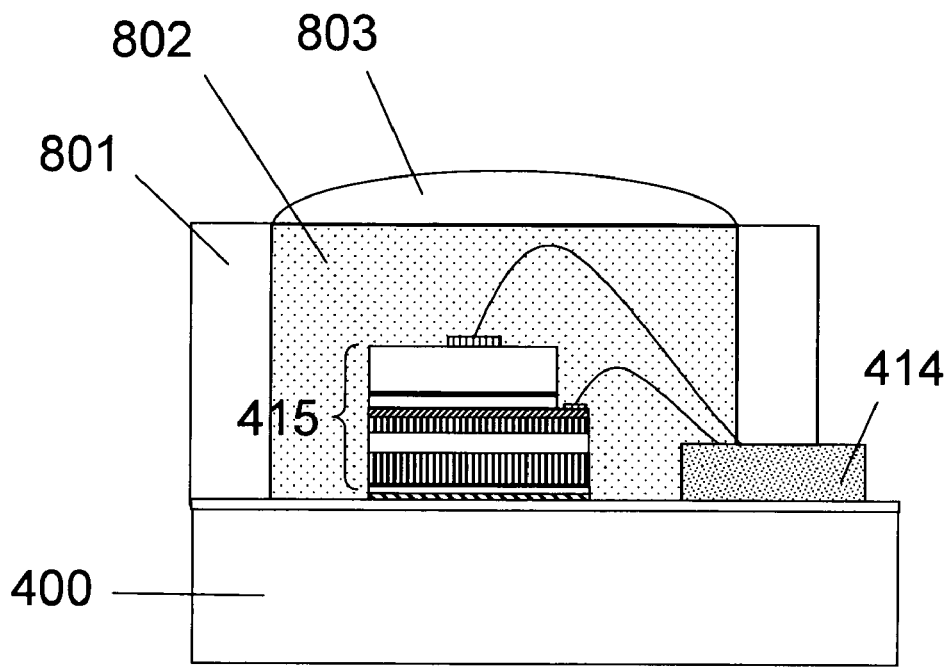
FIG. 8a shows a cross section of a light emitting projection system of the present invention, which includes a light emitting module with simplified packaging and secondary optics, including shaped cup, encapsulant and a lens.
Figure 8B:
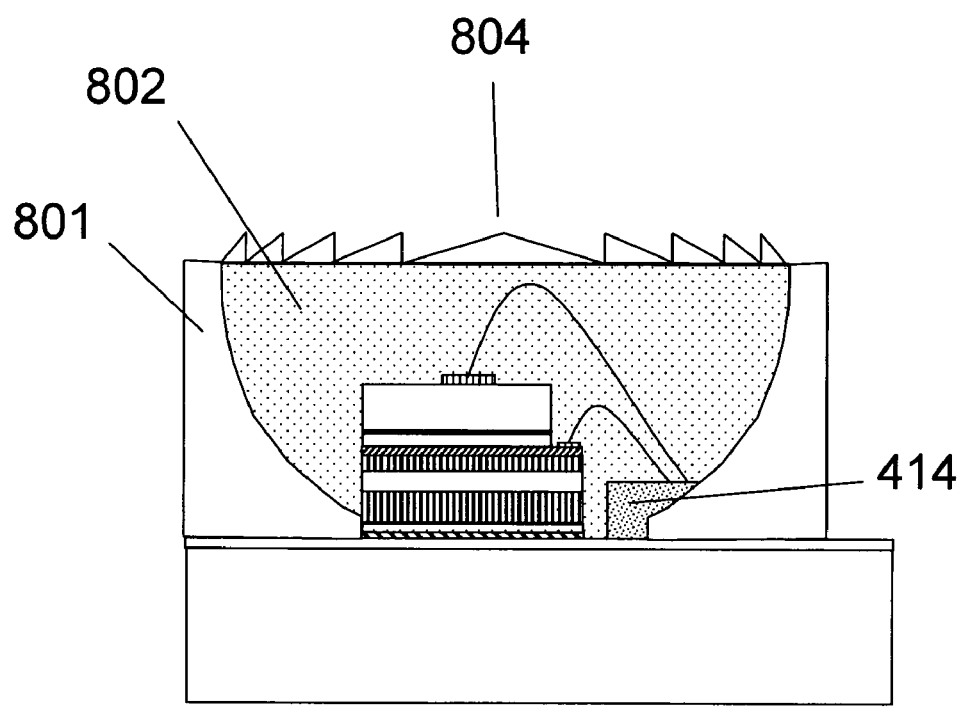
FIG. 8b shows a cross section of an embodiment of another light emitting projection system of the present invention, which includes a light emitting module with simplified packaging and diffractive optical element, including shaped cup and encapsulant; and, FIGS. 9a to 9e show a preferred method of fabrication of a light emitting module of the present invention.

In another aspect of the present invention a light emitting projection system comprises a light emitting module or light emitting system of the present invention with secondary optics designed for general lighting applications. This is shown in FIGS. 8a and 8b. The secondary optics, 803 and 804, are designed to direct the light in specific emission radiation cones. A reflector cup or receptacle, 801, is used to redirect side emitting light extracted from the EIVL LED or light emitting device into the direction of the secondary optics.

The reflector cup or receptacle, 801, may also be filled with an encapsulant 802. The encapsulant is employed to protect the light emitting device from the environment and the wire bonds residing in the light emitting module from physical contact and damage. Partial or complete mixing of the encapsulant 802 with Phosphors allows the narrow emission bandwidth of the light emitting device to be converted to multi-wavelength emission for white light general lighting or other applications. The Phosphor impregnated in the encapsulant may reside distal to the light emitting device to minimise thermal degradation of the Phosphor. The Phosphor may comprise of single or multiple component materials. The resultant increased refractive index of the encapsulant can be used for improved light extraction out of the light emitting device. Examples of a suitable encapsulant include resins, epoxies, PMMA, polymers, Silicones and inorganic materials.

The secondary optics may comprise any single or complex lens systems or any other suitable optical system. For example, this may comprise Diffractive Optical Elements (DOE) such as element 804 shown in FIG. 8b. It is also noted that the secondary optics and the encapsulant may comprise the same material.

In the final aspect of the present invention a method of manufacture of the light emitting device and module is proposed. A basic schematic of the processing steps are highlighted in FIG. 9.

An example GaN based LED is epitaxially grown on a suitable growth wafer 900. The growth wafer can comprise, but is not limited to, Sapphire, Silicon Carbide, free-standing GaN, LiAlO or any other lattice-matched material. The growth wafer can also comprise of non-lattice matched materials such as Si, this is particularly beneficial when moving to larger six inch (152.4 mm) wafer diameters. This growth can be achieved by use of stress-relief layers such as nanocolumnar GaN, AlN or ZnO.

The LED device comprises at least n-type semiconductor layer 409, followed by an active light emitting region 408, subsequently followed by a top p-doped semiconductor material 407. The active region 408 can comprise a single quantum well (QW) region or multiple quantum wells (MQW). These layers are grown by conventional semiconductor growth techniques such as metal organic vapour phase epitaxy (MOCVD) and molecular beam epitaxy (MBE), or alternatively atomic layer deposition (ALD) or other similar technique.

In the case of n-GaN layer 409, the layer can have a thickness of about 0.5 μm, 1.5 μm, 2.0 μm, 2.5 μm, 3 μm and 4 μm. The MQW region 408 can comprise InGaN/GaN or AlGaN/GaN multilayer stacks. When these layers are forward biased they can emit light in the wavelength region between 240 nm and 680 nm. In the case of the p-doped GaN layer, the thickness can vary between 5 nm and 400 nm, and is preferably about 50 nm, 100 nm, 150 nm, or 180 nm. It is important to note that the structure will be inverted, and hence the initial top surface will reside at the bottom of the device once the processing steps are complete.

In the example shown, the method of manufacture employs conductive vias embedded in reflective multilayers stacks (CVMR) as the top electrode 410 and bottom electrode 416.

Figure 9A:
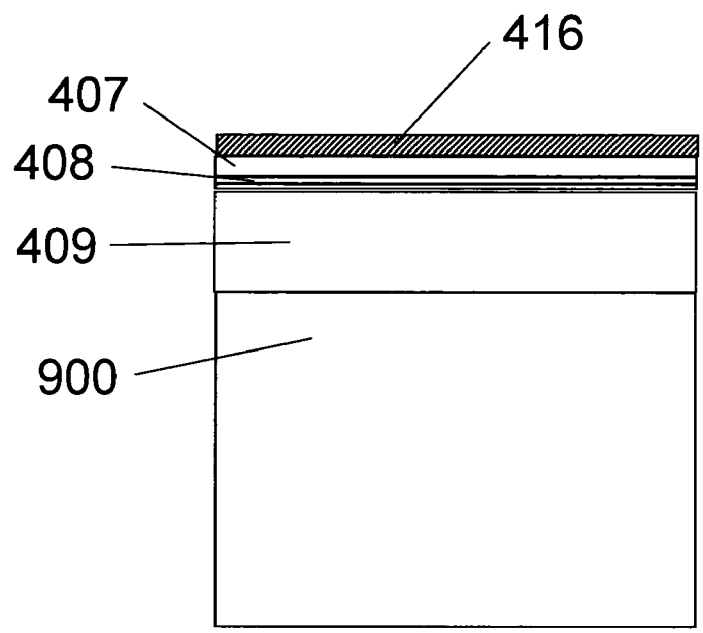

As shown in FIG. 9a, the bottom transparent CVMR stack 416 is deposited first. This may be carried out by any conventional deposition technique such as, but not limited to, any chemical vapour deposition technique (CVD), such as low-pressure chemical vapour deposition (LPCVD), plasma-enhanced chemical vapour deposition (PECVD), atomic layer deposition (ALD), or other low temperature techniques such as sputtering or evaporation such as, but not limited to, Plasma assisted or enhanced deposition, Ion Beam assisted deposition, electron beam assisted deposition, Remote Plasma assisted deposition, open and closed field magnetron sputtering.

The vias are then defined via a lithography process and etched via a dry or wet etch down to contact the underlying semiconductor. A metallic contact layer is subsequently deposited on the structure. This layer also acts as a good adhesion layer between the metal permanent substrate and the underlying p-doped GaN or semiconductor region. This contact region is preferably formed from Ni/Au, Ti/Au, Cr/Au, Au, Pd, Pt, Ru, Ni, Cr, ZnO, CNT, Ag, ITO, Al, or W, although other materials are possible. The metal is grown by evaporation, sputtering, electroplating or electro-less plating.

Figure 9B:
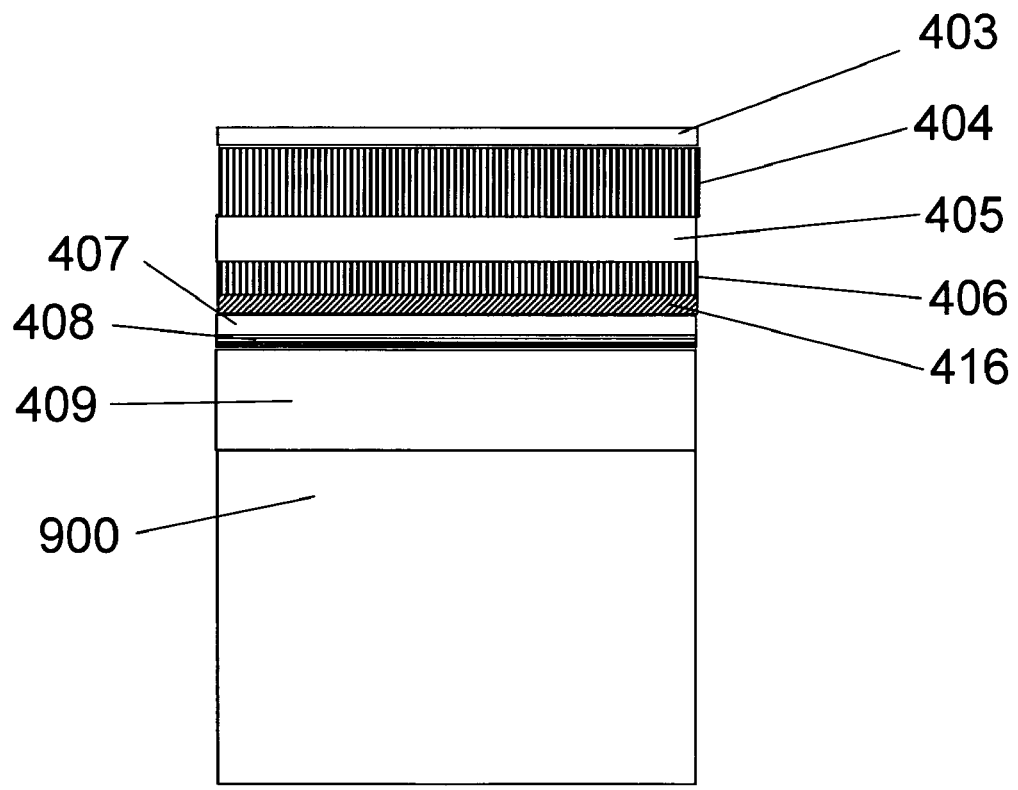

Subsequently, as shown in FIG. 9b, first deposited buffer layer 406, followed by deposited isolation layer 405, and finally second deposited buffer layer 404, are put down above the layer 416. These layers can be deposited by any sputtering or evaporation techniques. Preferred techniques include but not limited to Plasma assisted or enhanced deposition, Ion Beam assisted deposition, electron beam assisted deposition, Remote Plasma assisted deposition, open and closed field magnetron sputtering.

Following the deposition of the layers 406 and 405, a metal adhesion layer 403 is formed on the top surface. Layer 403 can be deposited using similar deposition techniques to layers 405 and 406, as well as e-beam evaporation, electroplating or electro-less plating.

Figure 9C:
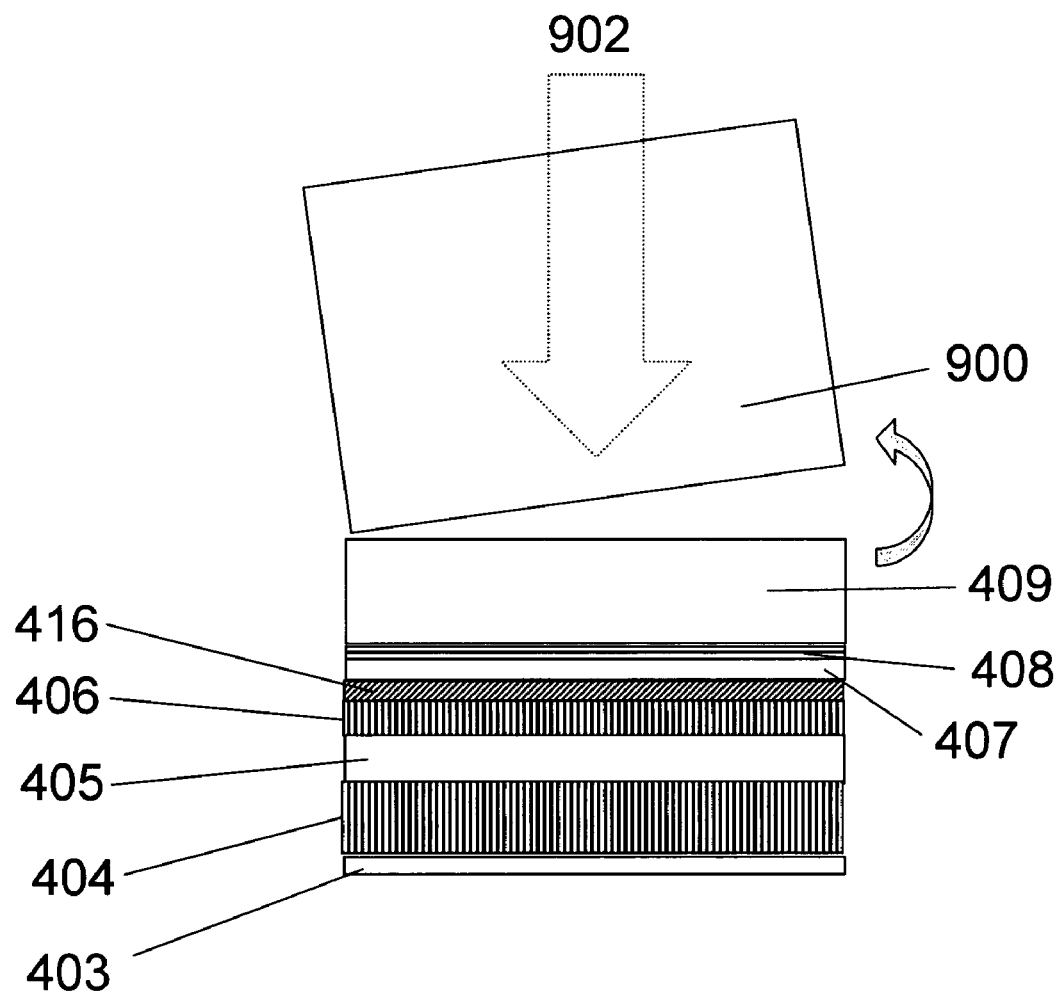

The new thick structure, comprising of layers 403, 404, 405, 406 and 416, provides a rigid support to hold the underlying LED die during removal of the growth substrate 900. The removal process can be achieved by a selective etching process, lift-off process such as laser lift-off (902), or polishing method. A combination of such devices can also be implemented. Following removal of the growth substrate 900, the LED dies are flipped, as shown in FIG. 9c.

Figure 9D:
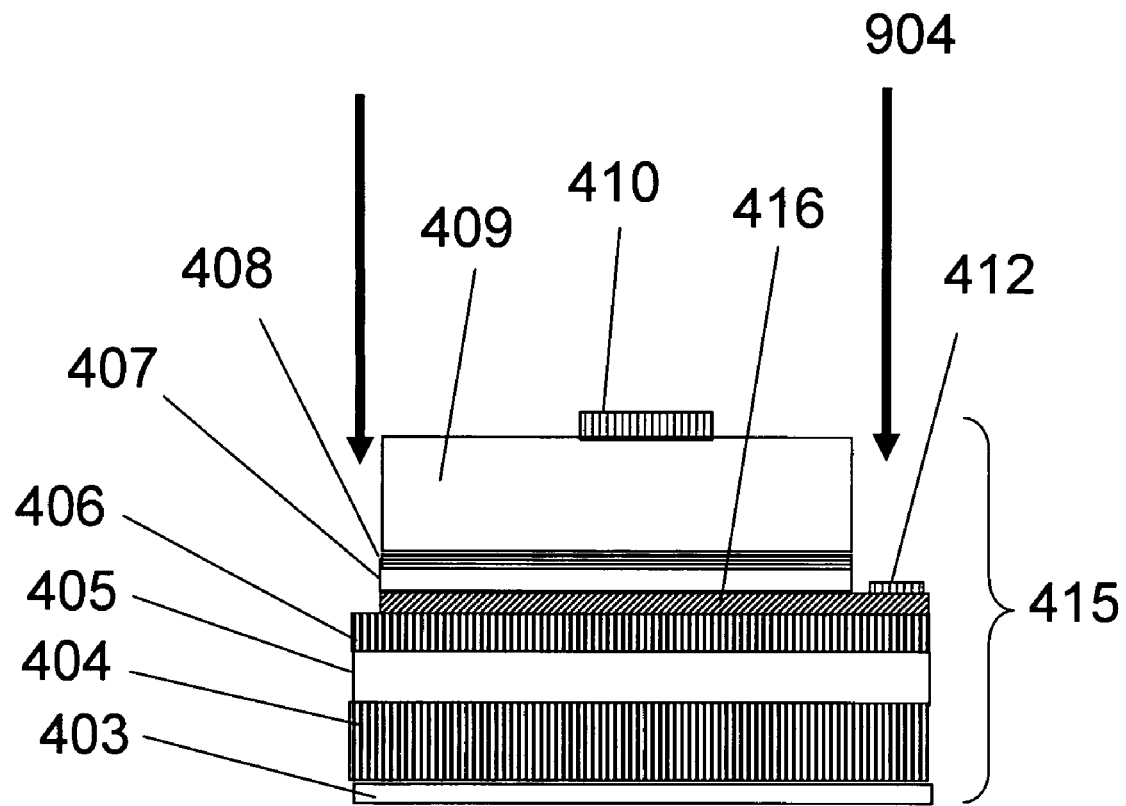

Using a lithographic or non-lithographic imprint and a resist process, the light emitting mesa layout is defined for the EIVL LEDs. The semiconductor layers 407, 408 and 409 are etched using a technique such as, but not limited to, an RIE or ICP etch, as shown in FIG. 9d. The etch performed at step 904 is allowed to penetrate into the light emitting device layers, but stop at the electrically conducting mirror layer 416. A selective etch stop may be employed to due to the different materials employed in layer 416 and those in the semiconductor layers. This etch step also introduces the isolation between individual light emitting devices.

The metal contacts 410 and 412 are further deposited using sputtering or evaporation or electroplating techniques and the location of the contacts is defined using photolithography and lift-off process. The EIVL LED light emitting device 415 is thus formed.

Figure 9E:
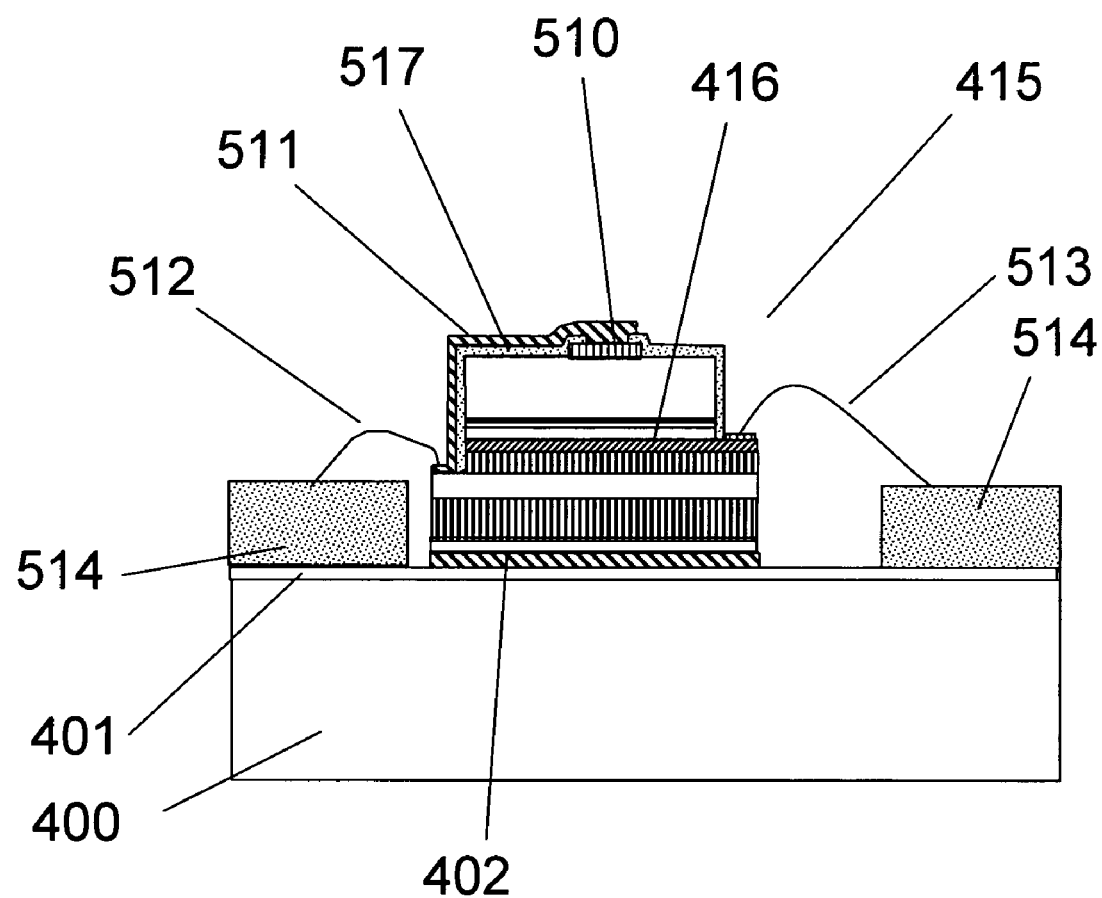

A passivation layer 517, may also be deposited conformally overcoating the exposed semiconductor surfaces of the EIVL LED as shown in FIG. 9e. This can be deposited using any conventional deposition technique such as, but not limited to, any chemical vapour deposition technique (CVD), such as low-pressure chemical vapour deposition (LPCVD), plasma-enhanced chemical vapour deposition (PECVD), atomic layer deposition (ALD), or other low temperature techniques such as sputtering or evaporation such as, but not limited to, Plasma assisted or enhanced deposition, Ion Beam assisted deposition, electron beam assisted deposition, Remote Plasma assisted deposition, open and closed field magnetron sputtering. The passivation layer can comprise, but is not limited to, $SiO_2$, $Si_3N_4$, polymer or spin-on-glass.

The electrical tracking 511 shown in FIG. 9e is deposited on top of the passivation layer 517. The layout of the tracks can also be defined using resist, photolithography and a lift off process. Alternatively, a shadow mask may also be used. The tracking is deposited using deposition techniques similar to those used for layers 405 and 406, as well as e-beam evaporation, electroplating or electro-less plating.

The metal substrate is evaporated with an adhesion layer 401 such as, but not limited to, Ni, Cr, Ti or Rt. A second solder layer 402 is deposited on the substrate carrier. Similar techniques to those employed for layer 403 may be used for the deposition of such a layer. This layer may include metals such as, but not limited to, Pt—Au, Al—Ti—Au, Al, Au, Au—W, Cu, Ti, and Pd. A circuit board 514 is subsequently attached to part of the substrate. No special requirements thermal or adhesion properties are needed for attach to the substrate as the sole purpose of the circuit board is electrical circuit layout. The die attach layer may employ materials such an adhesive, epoxy or resin.

The light emitting device 415 is die bonded onto the carrier substrate. This can be performed using techniques such as eutectic or solder die bonding. It is noted that the device 415 is not bonded onto 514 but directly onto layer 402.

Finally, the wire bonds 512 and 513 are attached from the n- and p-electrodes of the light emitting device to the circuit board 514. The correct pressure, heat and ultrasonic energy is optimised and applied to the wire bonds to achieve the correct bonding.

The invention claimed is:

1. A light emitting device comprising the following layers:
   a first semiconductor layer with doping of the first type;
   a second semiconductor layer with doping of the second type;
   a light emitting region interdisposed between first and second semiconductor layer, wherein light generated in the light emitting region is extracted from a surface of the second semiconductor layer;
   an electrical conducting mirror layer disposed proximal to the first semiconductor layer and distal to the second semiconductor layer and at least partially extending across a surface of the first semiconductor layer, wherein at least 60% of light generated in the light emitting region and incident on the electrical conducting mirror layer is reflected;
   an isolation layer disposed proximal to the electrical conducting mirror layer and distal to the first semiconductor layer, wherein the isolation layer is a deposited layer conformal with the electrical conducting mirror layer and comprises an electrically insulating material with a thermal conductivity greater than 130 W/(m·K);
   a first electrode disposed on the electrical conducting mirror, wherein the first electrode is not in contact with the first or the second semiconductor layer; and
   a second electrode disposed on the second semiconductor layer.

2. A light emitting device according to claim 1, further comprising a first buffer layer disposed proximal to the deposited isolation layer and to the electrical conducting mirror layer to aid adhesion therebetween, wherein the first buffer layer is a deposited layer conformal with the deposited isolation layer and has a thermal conductivity greater than 40 W/(m·K).

3. A light emitting device according to claim 2, wherein the first deposited buffer layer comprises a material selected from a group which includes metals, semiconductors, metal oxides, metal nitrides, dielectrics, polymer, hydrocarbons, epoxies, resins or mixtures and multilayers thereof.

4. A light emitting device according to claim 2, further comprising a second buffer layer disposed distal to the electrical conducting mirror layer and proximal to the deposited isolation layer to aid adhesion thereto, wherein the second buffer layer is a deposited layer conformal with the deposited isolation layer and has a thermal conductivity greater than 40 W/(m·K).

5. A light emitting device according to claim 4, wherein the second deposited buffer layer comprises a material selected from a group which includes metals, semiconductors, metal oxides, metal nitrides, dielectrics, polymer, hydrocarbons, epoxies, resins or mixtures and multilayers thereof.

6. A light emitting device according to claim 1, wherein the electrically insulating material is selected from Diamond-like Carbon, and Aluminum Nitride.

7. A light emitting device according to claim 1, wherein the thickness of the deposited isolation layer is in the range of 50 nm to 50 micrometers.

8. A light emitting device according to claim 7, wherein the deposited isolation layer has an electrical breakdown voltage of at least 0.5 kV.

9. A light emitting device according to claim 1, wherein the electrical conducting mirror layer comprises one of a metal, a metal multilayer, a transparent conductive oxide, a transparent conductive nitride, an omni-directional reflector (ODR), a conductive multilayer reflector (CMR), and a multilayer reflector with embedded conductive via (CVMR).

10. A light emitting module comprising:
a light emitting device according to claim 1;
a substrate with high thermal conductivity properties;
a die attach layer interspaced between the light emitting device and the substrate for providing physical attachment;
a circuit layout board residing on a surface of the substrate; and,
at least one electrical connector connecting the first electrode to the circuit layout board and at least another electrical connector connecting the second electrode to the circuit layout board, the electrical connectors providing a path for electrical current flow,
wherein the light emitting device is electrically isolated from the substrate.

11. A light emitting module according to claim 10, wherein the substrate comprise a material selected from metal, multilayer of metal, metal alloys, IMS-PCB and High Thermal Path IMS PCB.

12. A light emitting module according to claim 10, wherein the die attach layer comprises a solder layer.

13. A light emitting module according to claim 12, wherein the solder layer is formed using solder selected from eutectic solder, solder alloy, solder pre-form and solder paste.

14. A light emitting module according to claim 10, wherein the die attach layer comprises a material selected from epoxy adhesive, resin, thermoplastic, and silver glass.

15. A light emitting module according to claim 10, wherein the circuit layout board is a printed circuit board (PCB).

16. A light emitting projection system comprising:
a light emitting module according to claim 10;
a reflector cup attached to the substrate that is at least partially reflecting for light emitted from the one or more light emitting devices; and,
encapsulation disposed around the one or more light emitting devices and confined by the reflector cup.

17. A light emitting projection system according to claim 16, further comprising at least one secondary optical element.

18. A light emitting projection system according to claim 17, wherein the secondary optical element is selected from a group which includes a lens and diffractive optical element.

19. A light emitting projection system according to claim 16, wherein at least a part of the encapsulation comprises an embedded Phosphor.

20. A light emitting module comprising:
a light emitting device according to claim 1;
a substrate with high thermal conductivity properties;
a die attach layer interspaced between the light emitting device and the substrate for providing physical attachment;
a circuit layout board residing on a surface of the substrate;
electrical tracking partially disposed on the light emitting device; and,
at least one electrical connector connecting the electrical tracking to the circuit layout board and at least another electrical connector connecting the first electrode to the circuit layout board, the electrical connectors providing a path for electrical current flow,
wherein the light emitting device is electrically isolated from the substrate.

21. A light emitting module according to claim 20, wherein the electrical tracking is defined by means of a lift-off process.

22. A light emitting module comprising:
a plurality of light emitting devices, each light emitting device according to claim 1;
a substrate with high thermal conductivity properties;
a die attach layer interspaced between the plurality of light emitting devices and the substrate for providing physical attachment;
a circuit layout board residing on a surface of the substrate; and,
electrical tracking partially disposed on the plurality of light emitting devices,
wherein:
the plurality of light emitting devices are arranged on the substrate;
the plurality of light emitting devices are electrically isolated from the substrate; and,
at least one first electrode of at least one of the light emitting devices is connected to at least one second electrode of another of the light emitting devices to provide internal electrical connectivity between the light emitting devices.

23. A light emitting system comprising:
an alternating input current; and,
a light emitting module according to claim 22,
wherein electrical connectors of the light emitting devices, the electrical tracking and a circuit on the circuit layout board are configured to couple the alternating input current to the plurality of light emitting devices which thereby generate light.

24. A method of manufacture of a light emitting device of claim 1, wherein the device layers are fabricated in a wafer fabrication process, such that the isolation layer is conformal with the electrical conducting mirror layer and is deposited by an evaporation and/or sputtering technique.

25. A method according to claims 24, wherein evaporation and/or sputtering technique is selected from Plasma assisted or enhanced deposition, Ion Beam assisted deposition, electron beam assisted deposition, Remote Plasma assisted deposition, open and closed field magnetron sputtering.

* * * * *